United States Patent [19]

Yamakawa et al.

[11] Patent Number: 5,190,601
[45] Date of Patent: Mar. 2, 1993

[54] SURFACE STRUCTURE OF CERAMICS SUBSTRATE AND METHOD OF MANUFACTURING THE SAME

[75] Inventors: Akira Yamakawa; Akira Sasame, both of Hyogo, Japan

[73] Assignee: Sumitomo Electric Industries, Ltd., Osaka, Japan

[21] Appl. No.: 808,154

[22] Filed: Dec. 13, 1991

Related U.S. Application Data

[62] Division of Ser. No. 623,204, Dec. 6, 1990, Pat. No. 5,134,461.

[30] Foreign Application Priority Data

Dec. 7, 1989 [JP] Japan .................... 1-318250

[51] Int. Cl.⁵ .................... C23C 10/60; C23C 14/14
[52] U.S. Cl. .................... 148/518; 148/527; 427/125; 427/383.5
[58] Field of Search .................... 148/518, 527, 537; 427/125, 383.5, 96

[56] References Cited

U.S. PATENT DOCUMENTS

| | | | |
|---|---|---|---|
| 4,521,257 | 6/1985 | Gevatter et al. | 148/518 |
| 4,551,184 | 11/1985 | Bell et al. | 148/518 |
| 4,910,094 | 3/1990 | Watanabe et al. | 428/680 |
| 5,023,407 | 6/1991 | Shirai et al. | 174/257 |
| 5,134,461 | 7/1992 | Yamakawa et al. | 428/680 |

FOREIGN PATENT DOCUMENTS 59-114846 7/1984 Japan .

Primary Examiner—George Wyszomierski
Attorney, Agent, or Firm—W. G. Frasse; O. H. Kane, Jr.

[57] ABSTRACT

Disclosed herein is a method of making a surface structure on a ceramic substrate capable of suppressing diffusion of Ni to an Au plating layer and of reducing the necessary thickness of the Au plating layer. A metallized layer (12), Ni layer (13) and Au layer (14) are formed in this order on a surface of a ceramic substrate (11). The substrate (11) is heated in a non-oxidizing atmosphere to cause an alloying reaction between the Ni layer (13) and the Au layer (14). Thereafter, an Au plating layer (16) is formed on the NiAu alloy layer (15). Since Ni in the NiAu alloy layer is not easily released, diffusion of Ni into the Au plating layer can be suppressed sufficiently. Therefore, the Au plating layer can be small in thickness, generally less than 1 micron.

6 Claims, 2 Drawing Sheets

SURFACE STRUCTURE OF CERAMICS SUBSTRATE AND METHOD OF MANUFACTURING THE SAME

CROSS-REFERENCE TO RELATED APPLICATIONS

This is a divisional of U.S. patent application Ser. No.: 07/623,204, filed: Dec. 6, 1990, now U.S. Pat. No. 5,134,461.

BACKGROUND OF THE INVENTION

1. Field of the Invention

The present invention relates to a ceramic substrate for mounting electronic components and the like thereon, and more particularly to a surface structure of a ceramic substrate having superior heat resistance and method of manufacturing the same.

2. Description of the Background Art

A surface of a ceramic substrate is metallized to mount or seal electronic components. With reference to FIG. 1 showing a conventional surface structure of a ceramic substrate, a refractory metal 2 such as W or Mo is formed by baking on a ceramic substrate 1 of alumina, for example, an Ni plating layer 3 is formed thereon, and an Au plating layer 4 is formed further thereon. The Ni plating layer 3 facilitates soldering of the electronic components or the like, and serves to protect the metallized layer 2 formed thereunder. The Au plating layer 4 prevents oxidation of the Ni plating layer 3 formed thereunder to provide superior connection between the Ni plating layer 3 and the electronic components, thereby maintaining superior reliability of the electronic components and the like.

When elements are to be bonded on the Au plating by soldering, the ceramic substrate or the surface of the ceramic substrate is heated. However, the uppermost Au layer is tarnished by the heating, which prevents superior bonding. The cause of the tarnish of the Au plating layer may be diffusion of Ni of the Ni plating layer into the Au plating layer caused by heating, in which Ni is coupled with oxygen introduced from the air, providing Ni oxide.

In order to avoid the above described problem, the thickness of the Au plating layer is generally made as thick as about 2 μm. However, in order to reduce cost, the Au plating layer should preferably be reduced in thickness.

Japanese Patent Laying Open No. 59-114846 discloses a method of suppressing diffusion of Ni in the Ni plating layer to the Au plating layer. More specifically, after the Ni plating layer is formed, the Ni plating layer is heat treated with a temperature range of 900° C. to 1400° C. in a reducing atmosphere, so as to improve heat resistance of the Ni plating layer.

However, the above method cannot sufficiently prevent tarnish of the Au plating layer. Especially when the thickness of the Au plating layer is not larger than 1 μm, the Au plating layer is tarnished when electronic components and the like are bonded.

SUMMARY OF THE INVENTION

The present invention was made in view of the foregoing and its object is to provide a surface structure of a ceramics substrate capable of suppressing diffusion of Ni in the Ni layer to the Au plating layer and of reducing thickness of the Au plating layer, and to provide a method of manufacturing the same.

The surface structure of the ceramic substrate in accordance with the present invention comprises an Au plating layer and an NiAu alloy layer therebelow on the surface of the ceramics substrate.

In the method of manufacturing the surface structure of the ceramic substrate in accordance with the present invention, a metallized layer, Ni layer and Au layer are formed in this order on the surface of the ceramic substrate, the substrate is heated in a non-oxidizing atmosphere to cause an alloying reaction between the Ni layer and the Au layer, and then an Au plating layer is formed on the NiAu alloy layer.

In the present invention, NiAu alloy layer is positioned below the Au plating layer. Since Ni in the NiAu alloy layer is not easily released, diffusion of Ni into the Au plating layer can be suppressed sufficiently. Therefore, the Au plating layer can be reduced in thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An example of a specific processing method to provide the surface structure of the ceramic substrate in accordance with the present invention will be described in conjunction with FIGS. 2A to 2E in the following.

Figure 1:
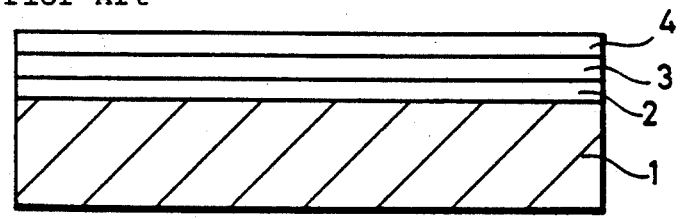
FIG. 1 is a sectional view showing a conventional surface structure of a ceramic substrate.
Figure 2A:
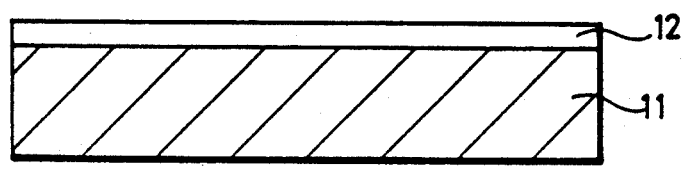
FIGS. 2A to 2E are sectional views for explaining a method of manufacturing a surface structure of a ceramic substrate in accordance with the present invention.

First, a metallized layer 12 is formed on a ceramic substrate 11, as illustrated in FIG. 2A. A refractory metal such as W, Mo or Ta may be employed as a metal for forming the metallized layer 12. A plating layer may be formed on the refractory metal layer. Vapor deposition, ion plating, sputtering or the like may be employed to form the metallized layer.

Figure 2B:
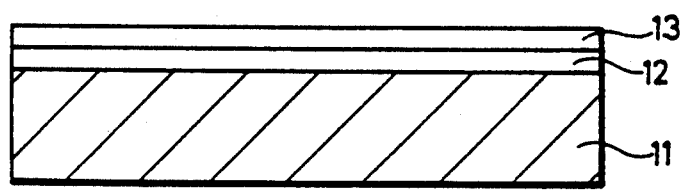

As illustrated in FIG. 2B, an Ni layer 13 is formed on the metallized layer 12. Various methods may be used for forming the Ni layer 13. Preferably, an electrolytic plating method is employed. Electroless plating may be employed. However, the Ni layer may be formed not by the plating method, but vapor deposition, ion plating or sputtering.

Figure 2C:
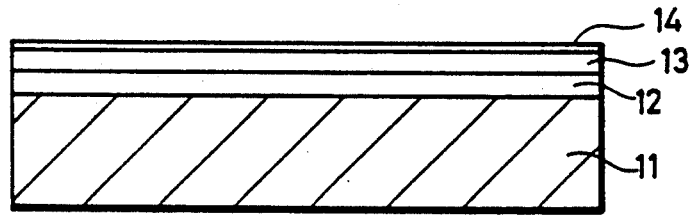

Then an Au layer 14 is formed on the Ni layer 13, as illustrated in FIG. 2C. At this time, the Au plating layer 14 may be formed by usual plating method or by vapor deposition, ion plating or sputtering. The Ni layer may be formed not directly on the metallized layer. The Ni layer may be formed after another metal layer is formed.

The above mentioned Ni layer 13 and the Au layer 14 should have as uniform thickness as possible on the entire surface, respectively. If these layers are not uniform in thickness, color shade may be generated. The ratio of thickness of the Au layer 14 to that of Ni layer 13 is preferably not larger than ½. If the thickness of the Au layer 14 is larger than this ratio, it will be difficult to have a suitable alloy layer by the alloying processing described later. The most preferable ratio of the thickness of the Au layer 14 to the Ni layer 13 is not higher than 1/10.

Figure 2D:
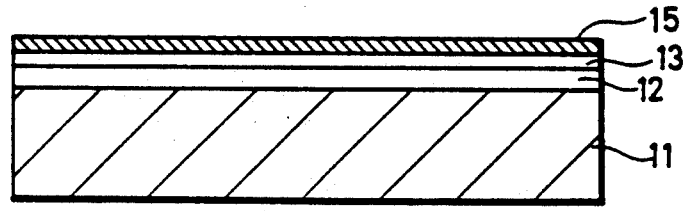

Then the ceramic substrate 11 having the metallized layer 12, the Ni layer 13 and the Au layer 14 thereon is heated for 4 to 5 minutes in a non-oxidizing atmosphere at a temperature higher than 500° C. to cause alloying reaction between the Ni layer 13 and the Au layer 14. By this heat treatment, an NiAu alloy layer 15 is formed as the uppermost layer, as illustrated in FIG. 2D.

Figure 2E:
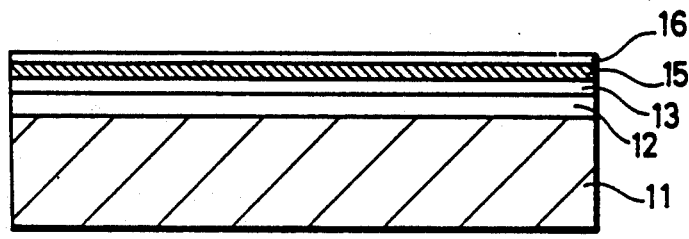

Then an Au plating layer 16 is formed by usual plating method on the NiAu alloy layer 15, as illustrated in FIG. 2E. Preferably, electrolytic plating method or electroless plating method is employed to form the Au plating layer 16. The heat resistance is improved as the thickness of the Au plating layer 16 is increased. However, since the NiAu alloy layer 15 below suppresses releasing of Ni, diffusion of Ni to the Au plating layer 16 can be prevented as much as possible. Therefore, even if the thickness of the Au plating layer 16 is not larger than 1.0 μm, tarnish of the Au plating layer 16 is not generated during heating for bonding the electronic components and the like. The heat treatment for bonding is usually carried out under the condition of 450° C.×3 min. since the NiAu alloy layer 15 suppresses release of Ni, the sufficient thickness of the Au plating layer 16 is generally about 0.2 μm. In any case, the thickness of the Au plating layer 16 is determined corresponding to the necessary characteristics.

EXAMPLE

16 AlN substrates having W metallized layer were prepared. An Ni plating layer was formed under various conditions on each substrate, and an Au plating layer was formed thereon. Table 1 shows thicknesses of the plating layers corresponding to the respective samples.

TABLE 1

| Sample No. | Ni plating thickness (μm) | Au plating thickness (μm) | Heating temperature (°C.) | Uppermost Au plating layer (μm) | Tarnish evaluation |
|---|---|---|---|---|---|
| 1 | 3 | 0.1 | 900 | 0.05 | Δ |
| 2 | 3 | 0.1 | 900 | 0.1 | O |
| 3 | 3 | 0.1 | 900 | 0.3 | O |
| 4 | 3 | 0.1 | 900 | 0.8 | O |
| 5 | 3 | 0.1 | 900 | 1.0 | O |
| 6 | 3 | 0.1 | 400 | 0.5 | Δ |
| 7 | 3 | 0.1 | 700 | 0.5 | O |
| 8 | 3 | 0.1 | 1000 | 0.5 | O |
| 9 | 3 | 0.1 | — | 0.5 | X |
| 10 | 1 | 0.1 | 900 | 0.5 | Δ |
| 11 | 5 | 0.1 | 900 | 0.5 | O |
| 12 | 7 | 0.1 | 900 | 0.5 | O |
| 13 | 5 | 0.2 | 900 | 0.5 | O |
| 14 | 5 | 1.0 | 900 | 0.5 | O |
| 15 | 4 | 0.2 | 900 | 0.5 | O |
| 16 | 4 | 0.2 | 900 | 0.5 | O |

Except the sample No. 9, heat treatment was carried out for 15 samples with different heating temperatures in a current of hydrogen, to cause alloying reaction between the Ni plating layer and the Au plating layer. Finally, an Au plating layer was formed as the uppermost layer on each of the samples.

The tarnish of the uppermost Au plating layer of each sample was evaluated. The evaluation was carried out by heat-treating the finally obtained samples for 5 minutes in an atmosphere of 450° C., and the tarnish of the uppermost Au plating layer after heat treatment was examined. In Table 1, the mark o represents no tarnish, the mark Δ represents slight tarnish and X represents serious tarnish.

On the sample No. 15, an Ni layer having the thickness of 4 μm was formed by sputtering and an Au plating layer having the thickness of 0.2 μm was formed thereon by plating. On the sample No. 16, an Ni layer having the thickness of 4 μm was formed by sputtering, and an Au layer having the thickness of 0.2 μm was formed thereon by sputtering. Although tarnish was not exhibited on the sample No. 14, color shade appeared.

As to the sample No. 9 which exhibited serious tarnish, heat treatment for alloying reaction was not carried out on this sample. This is the cause of the serious tarnish of the uppermost Au plating layer.

As to the sample No. 1, the thickness of the uppermost Au plating layer was considerably small compared with other samples. Since the uppermost Au plating layer was too small in thickness, slight tarnish occurred.

As to the sample No. 6, the heating temperature for the alloying reaction was lower compared with other samples. The lower temperature is considered to be the cause of tarnish.

As to the sample No. 10, the thickness of the Ni plating layer was considerably smaller than other samples. This is considered to be the cause of tarnish of the uppermost Au plating layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a surface structure of a ceramic substrate, comprising the steps of
    forming a metallized layer, an Ni layer and an Au layer in this order on a surface of a ceramic substrate,
    heating said substrate in a non-oxidizing atmosphere to cause alloying reaction between the Ni layer and the Au layer thus forming a NiAu alloy layer, and forming an Au plating layer on the NiAu alloy layer.

2. A method according to claim 1 wherein said heat treatment for alloying reaction is carried out in a non-oxidizing atmosphere and at a temperature not less than 500° C.

3. A method according to claim 1, wherein a thickness of said Au plating player is not larger than 1.0 μm.

4. A method according to claim 1, wherein a thickness of said Au plating layer is in the range of 0.2 μm to 1.0 μm.

5. A method according to claim 1, wherein the ratio of the thickness of said Au layer to that of said Ni layer is not larger than ⅛.

6. A method of manufacturing a surface structure of a ceramic substrate, comprising the steps of
    forming a metallized layer of a refractory metal on a surface of an AlN substrate,
    forming an Ni layer on said metallized layer,
    forming on said Ni layer an Au layer having a thickness not larger than a half of a thickness of said Ni layer,
    heating said substrate in a non-oxidizing atmosphere and at a temperature not less than 500° C. to cause alloying reaction between said Ni layer and said Au layer thus forming a NiAu alloy layer, and
    forming an Au plating layer having a thickness not larger than 1.0 μm on said NiAu alloy layer.

* * * * *

UNITED STATES PATENT AND TRADEMARK OFFICE
CERTIFICATE OF CORRECTION

PATENT NO. : 5,190,601

DATED : March 2, 1993

INVENTOR(S) : Akira Yamakawa et al.

It is certified that error appears in the above-identified patent and that said Letters Patent is hereby corrected as shown below:

Please correct the title [54] to read: --METHOD OF MANUFACTURING A SURFACE STRUCTURE ON A CERAMIC SUBSTRATE--, Column 4, line 42, after "1" insert --,--, Column 4, line 52, before "Au" insert --first--.

Signed and Sealed this

Twenty-fifth Day of January, 1994

Attest:

BRUCE LEHMAN

Attesting Officer   Commissioner of Patents and Trademarks